(12) United States Patent
Fukaya et al.

(10) Patent No.: US 7,517,636 B2
(45) Date of Patent: Apr. 14, 2009

(54) PHOTOSENSITIVE RESIN COMPOSITION, PHOTOSENSITIVE ELEMENT, PRODUCTION METHOD OF RESIST PATTERN AND PRODUCTION METHOD FOR PRINTED CIRCUIT BOARD

(75) Inventors: Takahiro Fukaya, Hitachinaka (JP); Masaki Endou, Ibaraki-ken (JP); Takuji Abe, Hitachi (JP); Katsutoshi Itagaki, Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/296,911

(22) PCT Filed: May 29, 2001

(86) PCT No.: PCT/JP01/04496

§ 371 (c)(1),
(2), (4) Date: May 28, 2003

(87) PCT Pub. No.: WO01/92958

PCT Pub. Date: Dec. 6, 2001

(65) Prior Publication Data

US 2003/0186166 A1 Oct. 2, 2003

(30) Foreign Application Priority Data

May 29, 2000 (JP) ............... 2000-157530
Dec. 26, 2000 (JP) ............... 2000-395193

(51) Int. Cl.
- G03F 7/028 (2006.01)
- G03F 7/032 (2006.01)
- G03F 7/20 (2006.01)
- G03F 7/30 (2006.01)
- G03F 7/36 (2006.01)

(52) U.S. Cl. .............. 430/285.1; 430/920; 430/271.1; 430/325; 430/311; 430/313; 430/319

(58) Field of Classification Search ............. 430/270.1, 430/281.1, 286.1, 285.1, 905, 916, 271.1, 430/325, 313, 315, 311, 331
See application file for complete search history.

(56) References Cited

U.S. PATENT DOCUMENTS

| | | | | |
|---|---|---|---|---|
| 4,925,768 A | * | 5/1990 | Iwasaki et al. | 430/271.1 |
| 5,045,433 A | | 9/1991 | Kakumaru et al. | 430/281.1 |
| 5,260,149 A | * | 11/1993 | Monroe et al. | 430/1 |
| 5,476,749 A | | 12/1995 | Steinmann et al. | 430/269 |
| 5,679,485 A | * | 10/1997 | Suzuki et al. | 430/18 |
| 6,060,216 A | | 5/2000 | Ichikawa et al. | 430/284.1 |

FOREIGN PATENT DOCUMENTS

| | | |
|---|---|---|
| EP | 0305545 | 3/1989 |
| EP | 0935171 | 8/1999 |
| EP | 0999473 | 5/2000 |
| JP | 2-54255 | 2/1990 |
| JP | 5-224413 | * 9/1993 |
| JP | 5-232699 | 9/1993 |
| JP | 5-271129 | 10/1993 |
| JP | 6-75371 | 3/1994 |
| JP | 6-236031 | 8/1994 |
| JP | 6-242603 | 9/1994 |
| JP | 8-157744 | 6/1996 |
| JP | 8-286372 | 11/1996 |
| JP | 10-128897 A | 5/1998 |
| JP | 11-24260 A | 1/1999 |
| JP | 11-84641 A | 3/1999 |
| JP | 11-271971 | 10/1999 |
| TW | 223683 | 3/1992 |

OTHER PUBLICATIONS

Machine-assisted English translation of JP-5-224413, provided by JPO.*
Derwent English Abstract of JP 5-224413.*
Machine-assisted English translation of JP 05-232699 (Masaoka et al), provided by JPO.*
English Language Abstract of JP 5-271129.
English Language Abstract of JP 5-232699.
English Language Abstract of JP 2-54255.
English Language Abstract of JP 6-242603.

(Continued)

Primary Examiner—Sin J. Lee
(74) Attorney, Agent, or Firm—Greenblum & Bernstein, P.L.C.

(57) ABSTRACT

A photosensitive resin composition is here disclosed which satisfies the following (1) and (2):

(1) when a 1.0 wt % aqueous sodium carbonate solution is sprayed by a spray on a layer of the photosensitive resin composition having a thickness of 37 to 42 μm under the following conditions, the photosensitive resin composition layer being able to be removed within 20 seconds, the above conditions being that an internal diameter of a nozzle of the spray is 1.2 mm, a spraying pressure is 0.05 MPa, and a distance between a point of the spray nozzle which is closest to the photosensitive resin composition layer and the photosensitive resin composition layer is 50 mm; and (2) when the 1.0 wt % aqueous sodium carbonate solution is sprayed three times for 36 seconds under the above conditions on a cured film obtained by laminating a layer of the photosensitive resin composition having the above thickness on a copper-clad laminate having 18 three-continuous holes in which 3 holes each having a diameter of 6 mm are continuously integrated and which has a length of 16 mm, and then photo-curing the layer with an exposure capable of curing 24 steps in a 41-step tablet, the number of holes where the cured film is broken being 5 or less.

13 Claims, 1 Drawing Sheet

OTHER PUBLICATIONS

English Language Abstract of JP 8-157744.
English Language Abstract of JP 6-236031.
English Language Abstract of JP 08-286372.
English Language Abstract of JP 6-75371.
English Language Abstract of JP 11-271971.
English Language Abstract of JP 11-24260 A.
English Language Abstract of JP 11-84641 A.
English Language Abstract of JP 10-128897 A.

* cited by examiner

PHOTOSENSITIVE RESIN COMPOSITION, PHOTOSENSITIVE ELEMENT, PRODUCTION METHOD OF RESIST PATTERN AND PRODUCTION METHOD FOR PRINTED CIRCUIT BOARD

TECHNICAL FIELD

The present invention relates to a photosensitive resin composition, a photosensitive element, a production method of a resist pattern, and a production method of a printed wiring board.

BACKGROUND ART

Methods for producing a printed wiring board are classified into two a tenting method and a plating method. In the tenting method, copper through holes for mounting a chip are protected by use of a resist, followed by etching and stripping of the resist, so as to form a circuit board. Meanwhile, in the plating method, copper is deposited in through holes by electroplating, and the through holes are then protected by solder plating, followed by stripping of a resist and etching, so as to form a circuit board.

In these methods, a photosensitive resin composition and a photosensitive element are used as the resist, and in particular, from the viewpoint of running costs and a working environment, an alkali developable resist is primarily used. Then, after the resist is cured, uncured portions are removed by an alkali developer, followed by rinsing by means of a spray pressure. Thus, a photosensitive resin composition to be used is required to have a tenting property which makes the composition unbreakable against the developer and the spray pressure used for rinsing, i.e., tent reliability. Further, in the plating method in particular, since a current density in a finely lined portion on a printed wiring board is higher than a current density in a loosely wired portion, plating in the finely lined portion becomes thicker than the resist, so that the resist in the portion is apt to be resist residue (resist residue due to overhanging). Hence, it is necessary that the resist does not remain after stripping even if the plating is overhung, that is, it have excellent stripping property.

In response to such requests, a photosensitive resin composition using a vinyl urethane compound and having good tent reliability is disclosed in Japanese Patent Application Laid-Open No. 271129/1993. However, such a photosensitive resin composition tends to have difficulty in conforming to increases in resolution which has been increasingly demanded year by year along with increases in density and precision of wiring of a printed wiring board. It is assumed that this is ascribable to a fact that an isocyanate residue having an urethane bond does not have excellent developability.

Further, an acrylate compound in which a polyethylene glycol chain solely exists is disclosed in Japanese Patent Application Laid-Open No. 232699/1993. However, when the polyethylene glycol chain exists alone, hydrophilicity is so strong that such problems as the deterioration of tent reliability or stripping property occur. Meanwhile, an acrylate compound in which a polypropylene glycol chain exists alone exhibits low resolution. Further, such an acrylate compound can be easily removed by an alkali developer. Hence, it causes the occurrence of sludge which is insoluble in the developer, and the sludge causes a short or a break when adhered to a substrate.

In addition to the foregoing requirements with respect to tent reliability and stripping property, it has also been necessary to shorten developing time for the purpose of improving the produceabillty of a printed wiring board. The present inventors have studied reduction in developing time in order to make a production process short. Heretofore, when a photosensitive resin composition layer having a thickness of about 37 to 42 µm is developed, development requires at least 25 seconds. However, if the developing time can be reduced to 20 seconds or less, the developing time is significantly reduced, and production time is in turn reduced. To reduce developing time, it is effective to improve the hydrophilicity of a binder polymer of the photosensitive resin composition However, an improvement in the hydrophilicity of the photosensitive resin composition lowers resistance to the developer, so that breakages of tents are liable to increase, in other words, tent reliability is liable to be lowered. For this reason, a photosensitive resin composition which achieves a reduction in developing time and has fully satisfactory tent reliability has heretofore not been available.

DISCLOSURE OF THE INVENTION

An object of the present invention is to provide a photosensitive resin composition which can shorten developing time and has high stripping property and tent reliability.

The present invention is a photosensitive resin composition which satisfies the following (1) and (2). (1) When a 1.0 wt % aqueous sodium carbonate solution is sprayed on a layer of the above photosensitive resin composition having a thickness of 37 to 42 µm under the following conditions, the photosensitive resin composition layer can be removed within 20 seconds. The above conditions are that an internal diameter of a spray nozzle is 1.2 mm, a spraying pressure is 0.05 MPa, and a distance between a point of the spray nozzle which is closest to the photosensitive resin composition layer and the photosensitive resin composition layer is 50 mm. (2) When a 1.0 wt % aqueous sodium carbonate solution is sprayed three times for 36 seconds (36 seconds per time) under the foregoing conditions on a cured film obtained by laminating a layer of the photosensitive resin composition having the foregoing thickness on a copper-clad laminate having 18 three-continuous holes in which 3 holes each having a diameter of 6 mm are continuously integrated and which has a length of 16 mm, and then photo-curing the layer with an exposure capable of curing 24 steps in a 41-step tablet, the number of holes at which the layer is broken is 5 or less.

Further, the layer of the photosensitive resin composition of the present invention can be removed preferably within 19 seconds, and more preferably within 18 seconds.

Further, the present invention is a photosensitive resin composition comprising (A) a binder polymer, (B) a photopolymerizable compound and (C) a photopolymerization initiator, wherein the component (B) contains polyalkylene glycol di(meth)acrylate having both an ethylene glycol chain and a propylene glycol chain in its molecule, and the component (C) contains acridine or an acridine-based compound having at least one acridinyl group in its molecule.

Further, in the photosensitive resin composition of the present invention, the component (C) includes a acridine-based compound having at least one acridinyl group in its molecule represented by a general formula (II):

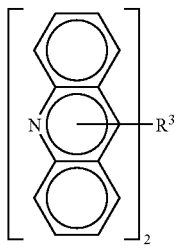

(where $R^3$ represents an alkylene group having 6 to 12 carbon atoms).

Further, the present invention is a photosensitive resin composition comprising (A) a binder polymer, (B) a photopolymerizable compound and (C) a photopolymerization initiator, wherein the component (A) is a polymer component having a weight average molecular weight of 30,000 to 70,000, and the component (B) includes a photopolymerizable compound which has at least one ethylenically unsaturated bond in its molecule and which has 15 or more alkylene glycol units each having 2 to 6 carbon atoms.

Further, the present invention is a photosensitive resin composition comprising (A) a binder polymer, (B) a photopolymerizable compound and (C) a photopolymerization initiator, wherein the component (A) is a polymer component having a weight average molecular weight of 30,000 to 70,000, and the component (B) includes a photopolymerizable compound which has at least one ethylenically unsaturated bond in its molecule and a molecular weight of not lower than 900.

Further, the present invention is a photosensitive resin composition comprising (A) a binder polymer, (B) a photopolymerizable compound and (C) a photopolymerization initiator, wherein based on 100 parts by weight of a total of the components (A) and (B), the amount of the component (A) is 40 to 80 parts by weight, the amount of the component (B) is 20 to 60 parts by weight, and the amount of the component (C) is 0.01 to 3 parts by weight.

Further, the present invention is a photosensitive element prepared by applying any of the above photosensitive resin compositions on a substrate, and drying the applied composition.

Further, the present invention is a production method of a resist pattern which comprises the steps of: laminating the above photosensitive element on a substrate for forming a circuit so that the photosensitive resin composition layer may come in intimate contact with the substrate; irradiating it with active light imagewise so as to photo-cure an exposed potion; and removing an unexposed portion by development.

Further, the present invention is a production method of a printed wiring board which comprises etching or plating a substrate for forming a circuit which has a resist pattern produced thereon by the foregoing resist pattern production method.

According to the present invention, since high-speed development is possible, excellent tent reliability can be attained, and entry of an etching solution, a plating solution or the like into through holes can be prevented efficiently. As a result, poor conduction, an improper short and the like in a printed wiring board can be prevented, so that a printed wiring board can be produced at high yield, consequently, by significantly increasing the speed of a production line of printed wiring boards so as to reduce production time, workability and productivity can be improved.

Further, according to the present invention, excellent tent reliability, stripping property (overhang stripping property), light sensitivity, resolution, chemical resistance (plating resistance) and flexibility can be imparted to a photosensitive resin composition. Therefore, the present invention is useful for increasing the density and resolution of printed wiring.

Still further, according to the present invention, occurrence of sludge can be decreased.

The present disclosure relates to subject matter contained in Japanese Patent Application Nos. 157530/2000 and 395193/2000, the disclosure of which is expressly incorporated herein by reference in its entirety.

BEST MODE FOR CARRYING OUT THE INVENTION

Figure 1:
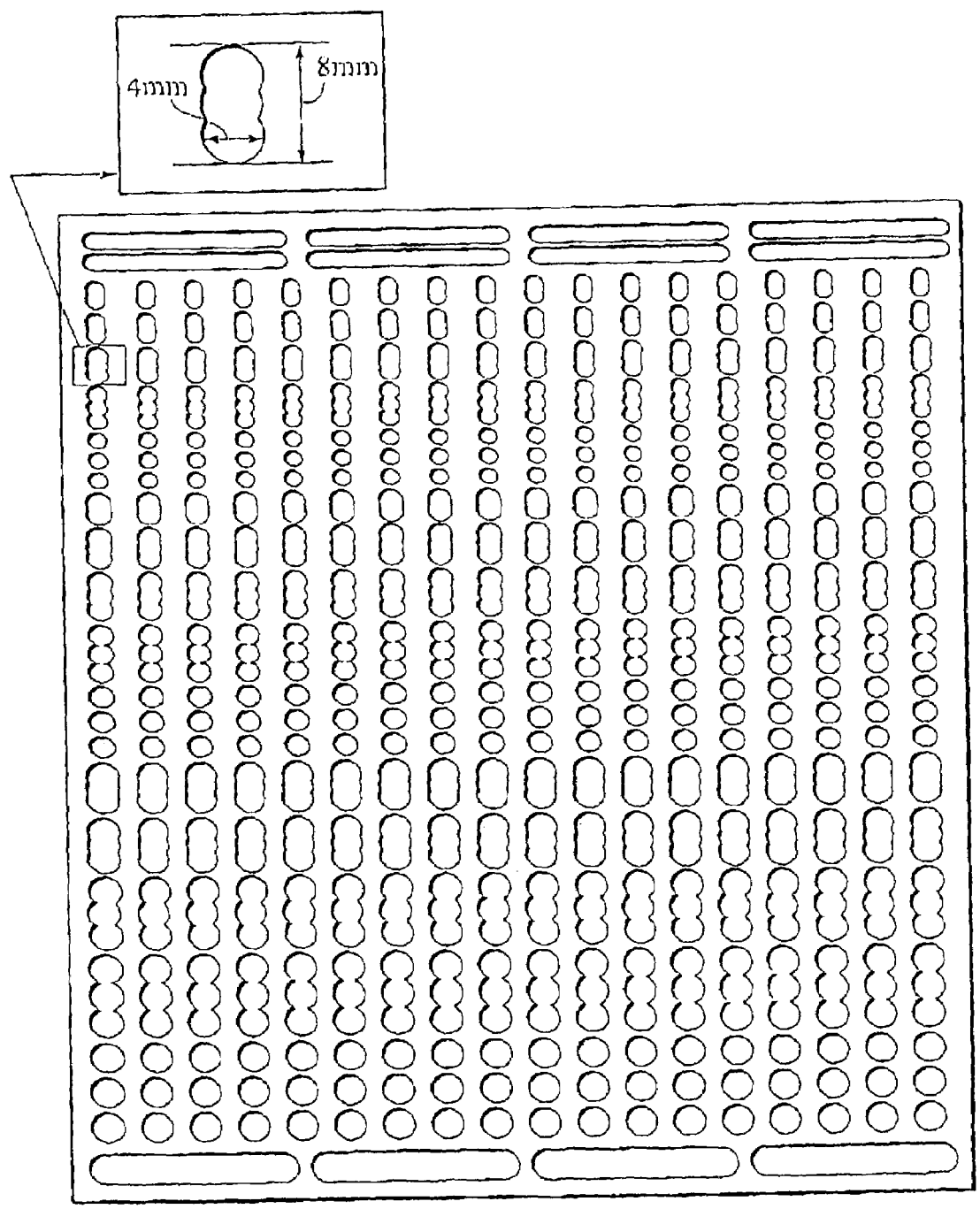
FIG. 1 is an external view of an evaluation substrate used for evaluating an irregularly shaped tent breakage rate in an experimental example of the present specification.

Hereinafter, the present invention will be described in detail. In the present invention, (meth)acrylic acid, refers to acrylic acid and corresponding methacrylic acid, a (meth) acrylate refers to an acrylate and a corresponding methacrylate, and a (meth)acryloyl group refers to an acryloyl group and a corresponding methacryloyl group.

A photosensitive resin composition of the present invention is a photosensitive resin composition which satisfies the following (1) and (2). (1) When a 1.0 wt % aqueous sodium carbonate solution is sprayed on a layer of the above photosensitive resin composition having a thickness of 37 to 42 μm under the following conditions, the photosensitive resin composition layer can be removed within 20 seconds. The above conditions are that an internal diameter of a spray nozzle is 1.2 mm, a spraying pressure is 0.05 MPa, and a distance between a point of the spray nozzle which is closest to the photosensitive resin composition layer and the photosensitive resin composition layer is 50 mm. (2) When a 1.0 wt % aqueous sodium carbonate solution is sprayed three times for 36 seconds under the foregoing conditions on a cured film obtained by laminating a layer of the photosensitive resin composition having the foregoing thickness on a copper-clad laminate having 18 three-continuous holes in which 3 holes each having a diameter of 6 mm are continuously integrated and which has a length of 16 mm, and then photo-curing the layer with an exposure capable of curing 24 steps in a 41-step tablet, the number of holes at which the layer is broken is 5 or less.

The above photosensitive resin composition can be obtained by, for example, containing (A) a binder polymer, (B) polyalkylene glycol di(meth)acrylate having both an ethylene glycol chain and a propylene glycol chain in the molecule of a photopolymerizable compound and (C) acridine or an acridine-based compound having at least one acridinyl group in its molecule.

Farther, the above photosensitive resin composition can be obtained by, for example, containing (A) a polymer component having a weight average molecular weight of 30,000 to 70,000, (B) a photopolymerizable compound having at least one ethylenically unsaturated bond in its molecule and having 15 or more alkylene glycol units each having 2 to 6 carbon atoms, and (C) a photopolymerization initiator.

Further, the above photosensitive resin composition can be obtained by, for example, containing (A) a polymer component having a weight average molecular weight of 30,000 to 70,000, (B) a photopolymerizable compound having at least one ethylenically unsaturated bond in its molecule and having a molecular weight of 900 or more, and (C) a photopolymerization initiator.

Illustrative examples of the above binder polymer (A) include an acrylic resin, a styrene resin, an epoxy resin, an amide resin, an amide epoxy resin, an alkyd resin, and a phenol resin. From the viewpoint of alkali developability, the acrylic resin is preferred. These can be used alone or in combination of two or more.

The binder polymer (A) used in the present invention can be produced by radical polymerization of a polymerizable monomer, for example.

Illustrative examples of the polymerizable monomer include styrene, a polymerizable styrene derivative such as vinyltoluene, α-methylstyrene, p-methylstyrene, p-ethylstyrene, p-methoxystyrene, p-ethoxystyrene, p-chlorostyrene or p-bromostyrene, acrylamide, acrylonitrile, a vinyl alcohol ester such as vinyl-n-butyl ether, alkyl (meth)acrylate, tetrahydrofurfuryl (meth)acrylate, dimethylaminoethyl (meth)acrylate, diethylaminoethyl (meth)acrylate, glycidyl (meth)acrylate, 2,2,2-trifluoroethyl (meth)acrylate, 2,2,3,3-tetrafluoropropyl (meth)acrylate, (meth)acrylic acid, α-bromo(meth)acrylate, α-chlor(meth)acrylate, β-furyl (meth)acrylate, β-styryl(meth)acrylate, maleic acid, maleic anhydride, a maleic monoester such as monomethyl maleate, monoethyl maleate or monoisopropyl maleate, fumaric acid, cinnamic acid, α-cyanocinnamic acid, itaconic acid, crotonic acid, and propionic acid.

Illustrative examples of the above alkyl (meth)acrylate include a compound represented by a general formula (I):

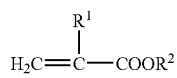

(I)

(wherein $R^1$ represents a hydrogen atom or a methyl group, and $R^2$ represents an alkyl group having 1 to 12 carbon atoms), and a compound obtained by substituting the alkyl group of the compound with a hydroxyl group, an epoxy group, a halogen group or the like.

Illustrative examples of the alkyl group having 1 to 12 carbon atoms which as represented by $R^2$ in the above general formula (I) include a methyl group, an ethyl group, a propyl group, a butyl group, a pentyl group, a hexyl group, a heptyl group, an octyl group, a nonyl group, a decyl group, an undecyl group, a dodecyl group, and structural isomers of these.

Illustrative examples of the monomer represented by the above general formula (I) include methyl (meth)acrylate, ethyl (meth)acrylate, propyl (meth)acrylate, butyl (meth)acrylate, pentyl (meth)acrylate, hexyl (meth)acrylate, heptyl (meth)acrylate, octyl (meth)acrylate, and 2-ethylhexyl (meth)acrylate. These can be used alone or in combination of two or more.

The above binder polymer (A) preferably contains a carboxyl group from the viewpoint of alkali developability and can be produced by, for example, radical polymerization of a polymerizable monomer having a carboxyl group with other polymerizable monomer. As the above polymerizable monomer having a carboxyl group, methacrylic acid is preferred.

Further, from the viewpoint of flexibility, the above binder polymer (A) preferably contains styrene or a styrene derivative as a polymerizable monomer.

To improve both adhesion and stripping property, the above styrene or styrene derivative is preferably contained as a copolymerization component in an amount of 2 to 30% by weight, more preferably 2 to 28% by weight, particularly preferably 2 to 27% by weight. When the content is lower than 2% by weight, adhesion is liable to be poor, while when it is higher than 30% by weight, pieces to be stripped become so large that stripping is liable to take long time.

These binder polymers are used alone or in combination of two or more. Illustrative examples of binder polymers to be used in combination of two or more include two or more binder polymers comprising different copolymerization components, two or tore binder polymers having different weight average molecular weights, and two or more binder polymers having different degrees of dispersion. Further, a polymer having multimode molecular weight distribution as disclosed in Japanese Patent Application Laid-Open No. 327137/1999 may also be used.

The binder polymer preferably has a weight average molecular weight of 30,000 to 70,000, more preferably 35,000 to 65,000, particularly preferably 40,000 to 60,000. When the molecular weight is lower than 30,000, film coatability and a tenting property are liable to be poor. Meanwhile, when the molecular weight is higher than 70,000, developing time is liable to be long. The weight average molecular weight is measured by means of gel permeation chromatography (GPC) and obtained by conversion based on a calibration curve using a standard polystyrene.

Further, when two or more binder polymers are used, the weight average molecular weight of a polymer component resulting from mixing of the binder polymers is measured. For example, the weight average molecular weight of a polymer component used in an experimental example to be describe later in the present specification and resulting from mixing of a binder polymer having a weight average molecular weight of 60,000 and a binder polymer having a weight average molecular weight of 30,000 was 55,000.

As for the degree of dispersion of the binder polymer, the degree of dispersion (weight average molecular weight/number average molecular weight) of a polymer mixture when two or more binder polymers are used in admixture or the degree of dispersion of a binder polymer when the polymer component is used alone is preferably 1.5 to 5.0, more preferably 1.8 to 4.0, particularly preferably 2.0 to 3.5. As in the case of the weight molecular weight, the number average molecular weight is also measured by GPC and converted by a standard polystyrene.

The photopolymerizable compound (B) used in the present invention preferably has at least one ethylenically unsaturated bond in its molecule. However, from the viewpoints of the tenting property and stripping property, the compound (B) contains more preferably two or more ethylenically unsaturated bonds, particularly preferably two ethylenically unsaturated bonds.

As the component (B), a photopolymerizable compound having 15 or more alkylene glycol units each of which has 2 to 6 carbon atoms can be used.

The number of the carbon atoms is preferably 2 to 6, more preferably 2 to 5, particularly preferably 2 or 3, from the viewpoint of the tenting property. Further, the number of the units, i.e., a total number of recurring units, is preferably 15 to 30, more preferably 15 to 25, particularly preferably 15 to 20. When the number of the units is smaller than 15, the tenting property and sensitivity are liable to be poor, and stripping time is liable to be long. Meanwhile, when the number of the units is larger than 30, resolution is liable to deteriorate, and a resist obtained is liable to be brittle.

The molecular weight of the component (B) is preferably 900 or more, more preferably 900 to 2,500, particularly preferably 1,000 to 1,500. When the molecular weight is lower than 900, the tenting property and the sensitivity are liable to be poor, and the stripping time is liable to be long.

The component (B) preferably contains polyalkylene glycol di(meth)acrylate having both an ethylene glycol chain and a propylene glycol chain in its molecule. The (meth)acrylate is not particularly limited as long as it has both an ethylene glycol chain and a propylene glycol chain (n-propylene glycol chain or isopropylene glycol chain) as alkylene glycol chains in its molecule. Further, the (meth)acrylate may also contain an alkylene glycol chain having about 4 to 6 carbon atoms, such as an n-butylene glycol chain, an isobutylene glycol chain, an n-pentylene glycol chain, a hexylene glycol chain, and structural isomers of these.

When a plurality of the above ethylene glycol chains and propylene glycol chains exist, the ethylene glycol chains and the propylene glycol chains each do not have to exist continuously and may exist randomly. Further, primary or secondary carbon in a propylene group in the above isopropylene glycol chain may be bonded to an oxygen atom.

Illustrative examples of an alkylene glycol chain in the molecule of polyalkylene glycol di(meth)acrylate having at least one polymerizable, ethylenically unsaturated bond and having both an ethylene glycol chain and a propylene glycol chain in its molecule in the component (B) include a compound represented by a general formula (III):

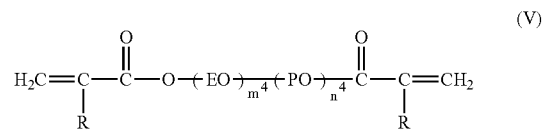

(wherein two Rs each independently represent a hydrogen atom or an alkyl group having 1 to 3 carbon atoms, EO represents an ethylene glycol chain, PO represents a propylene glycol chain, and $m^1$, $m^2$ and $n^1$ are each independently an integer of 1 to 30), a compound represented by a general formula (IV):

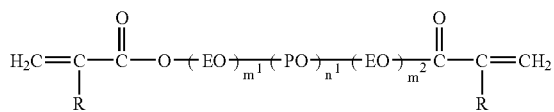

(wherein two Rs each independently represent a hydrogen atom or an alkyl group having 1 to 3 carbon atoms, EO represents an ethylene glycol chain, PO represents a propylene glycol chain, and $m^3$, $n^2$ and $n^3$ are each independently an integer of 1 to 30), and a compound represented by a general formula (V):

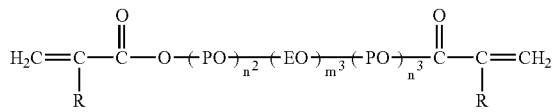

(wherein two Rs each independently represent a hydrogen atom or an alkyl group having 1 to 3 carbon atoms, EO represents an ethylene glycol chain, PO represents a propylene glycol chain, and $m^4$ and $n^4$ are each independently an integer of 1 to 30).

These are used alone or in a combination of two or more.

Illustrative examples of the alkyl groups having 1 to 3 carbon atoms in the foregoing general formulae (III), (IV) and (V) include a methyl group, an ethyl group, an n-propyl group and an isopropyl group.

Total numbers ($m^1+m^2$, $m^3$ and $m^4$) of repetitions of the ethylene glycol chains in the above general formulae (III), (IV) and (V) are each independently an integer of 1 to 30, preferably an integer of 1 to 10, more preferably an integer of 4 to 9, particularly preferably an integer of 5 to 8. When the number of repetitions exceeds 30, tent reliability and the shape of a resist are liable to deteriorate.

Total numbers ($n^1$, $n^2+n^3$, and $n^4$) of repetitions of the propylene glycol chains in the above general formulae (III), (IV) and (V) are each independently an integer of 1 to 30, preferably an integer of 5 to 20, more preferably an integer of 8 to 16, particularly preferably an integer of 10 to 14. When the number of repetitions exceeds 30, resolution is liable to deteriorate, and sludge is liable to be produced.

A specific example of the compound represented by the above general formula (III) is a vinyl compound (product of Hitachi Chemical Co., Ltd., trade name: FA-023M) wherein R is a methyl group, $m^1+m^2$ is 4 (average value), and $n^1$ is 12 (average value). A specific example of the compound represented by the above general formula (IV) is a vinyl compound (product of Hitachi Chemical Co., Ltd., trade name: FA-024M) wherein R is a methyl group, $m^3$ is 6 (average value), and $n^2+n^3$ is 12 (average value). A specific example of the compound represented by the above general formula (V) is a vinyl compound (product of Shin-Nakamura Chemical Co., Ltd., trade name: NK ESTER HEMA-9P) wherein R is a hydrogen atom, $m^4$ is 1 (average value), and $n^4$ is 9 (average value). There are used alone or in a combination of two or more.

Further, the component (B) may also contain photopolymerizable compounds other than the polyalkylene glycol di(meth)acrylate having both an ethylene glycol chain and a propylene glycol chain in its molecule. Specific examples of such other photopolymerizable compounds include compounds obtained by reacting a polyhydric alcohol with an α,β-unsaturated carboxylic acid, bisphenol-A-based (meth)acrylate compounds such as 2,2-bis(4-((meth)acryloxypolyethoxy)phenyl)propane, 2,2-bis(4-((meth)acryloxypolypropoxy)phenyl)propane, 2,2-bis(4-((meth)acryloxypolybutoxy)phenyl)propane and 2,2-bis(4-((meth)acryloxypolyethoxypolypropoxy)phenyl)propane, compounds obtained by reacting a glycidyl-group-containing compound with an α,β-unsaturated carboxylic acid, urethane monomers such as a (meth)acrylate compound having an urethane bond in its molecule, nonylphenoxypolyethyleneoxy acrylate, phthalic-acid-based compounds such as γ-chloro-β-hydroxypropyl-β'-(meth)acryloyloxyethyl-o-phthalate andβ-hydroxyalkyl-β'-(meth)acryloyloxyalkyl-o-phthalate, and alkyl (meth)acrylate. It is preferred that the bisphenol-A-based (meth)acrylate compound or the (meth) acrylate compound having an urethane bond in its molecule is contained as an essential component. These are used alone or in a combination of two or more.

As the photopolymerization initiator (C) used in the present invention, acridine or an acridine-based compound having at least one acridinyl group in its molecule is preferably used. Illustrative examples of the acridine-based compound include the compounds represented by the above general formula (II), 9-phenylacridine, 9-pyridylacridine, 9-pyridylacridine, and bis(9-acridinyl)alkanes such as 1,2-bis(9-acridinyl)ethane, 1,3-bis(9-acridinyl)propane, 1,4-bis(9-acridinyl)butane and 1,5-bis(9-acridinyl)pentane. These are used alone or in a combination of two or more.

Illustrative examples of the alkylene group having 6 to 12 carbon atoms in the above general formula (II) include a hexylene group, a heptylene group, an octylene group, a nonylene group, a decylene group, an undecylene group, a dodecylene group, and structural isomers of these.

Illustrative examples of the compound represented by the above general formula (II) include 1,6-bis(9-acridinyl)hexane, 1,7-bis(9-acridinyl)heptane, 1,8-bis(9-acridinyl)octane, 1,9-bis(9-acridinyl)nonane, 1,10-bis(9-acridinyl)decane, 1,11-bis(9-acridinyl)undecane, and 1,12-bis(9-acridinyl) dodecane. The above 1,7-bis(9-acridinyl)heptane can be obtained as a product of ASAHI DENKA CO., LTD. with a trade name: N-1717. These can be used alone or in a combination of two or more.

Further, the photosensitive resin composition of the present invention can-also contain photopolymerization initiators other than the above acridine or acridine-based compound (C) having at least one acridinyl group in its molecule. Illustrative examples of such other photopolymerization initiators include benzophenone, N,N'-tetraalkyl-4,4'-diaminobenzophenone such as N,N'-tetramethyl-4,4'-diaminobenzophenone (Michler's ketone), aromatic ketones such as 2-benzyl-2-dimethylamino-1-(4-morpholinophenyl)-butanone-1,2-methyl-1-[4-(methylthio)phenyl]-2-morpholino-propanone-1, quinones such as alkyl anthraquinone, benzoin ether compounds such as benzoin alkyl ether, benzoin compounds such as benzoin and alkyl benzoin, benzyl derivatives such as benzyl dimethyl ketal, 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer and 2-(p-methoxyphenyl)-4,5-diphenylimidazole dimer, N-phenylglycine, N-phenylglycine derivative, coumarin compounds, and onium salts. These are used alone or in a combination of two or more.

The above binder polymer (A) is added in an amount of preferably 40 to 80 parts by weight, more preferably 45 to 70 parts by weight, based on 100 parts by weight of a total of the components (A) and (B). When the amount is less than 40 parts by weight, a photo-cured product is liable to become brittle and exhibit poor coatability when used as a photosensitive element, while when it is more than 80 parts by weight, light sensitivity is liable to be unsatisfactory.

The above photopolymerizable compound (B) is added in an amount of preferably 20 to 60 parts by weight, more preferably 30 to 55 parts by weight, based on 100 parts by weight of the total of the components (A) and (B). When the amount is less than 20 parts by weight, light sensitivity is liable to be unsatisfactory, while when it is more than 60 parts by weight, the photo-cured product is liable to become brittle.

The proportion of the polyalkylene glycol di(meth)acrylate having both an ethylene glycol chain and a propylene glycol chain in its molecule, the compound having 15 or more alkylene glycol units each having 2 to 6 carbon atoms or the photopolymerizable compound having a molecular weight of 900 or more in the component (B) is preferably 30% by weight or more, more preferably 40% by weight or more, particularly preferably 50% by weight or more. When the proportion is lower than 30% by weight, the effect of the present invention is more preferable, and the proportion is particularly preferably 50% by weight or more. When the proportion is lower than 30% by weight, the effect of the present invention is liable not to be obtained.

The above photopolymerization initiator (C) is added in an amount of preferably 0.01 to 3 parts by weight, more preferably 0.1 to 2 parts by weight, based on 100 parts by weight of the total of the components (A) and (B). When the amount is less than 0.01 parts by weight, light sensitivity is liable to be unsatisfactory, while when it is more than 3 parts by weight, absorption on the surface of the composition increases upon exposure, so that photo-curing of the inside of the composition is liable to be insufficient.

The above photosensitive resin composition can contain a photopolymerizable compound having at least one cationic-polymerizable cyclic ether group in its molecule, a cationic polymerization initiator, a dye such as malachite green, tribromophenylsulfone, an optical color coupler such as leuco crystal violet, a thermal color development inhibitor, a plasticizer such as p-toluenesulfonamide, a pigment, a filler, an antifoaming agent, a flame retardant, a stabilizer, an adhesion imparting agent, a leveling agent, a stripping accelerator, an antioxidant, a perfume, an imaging agent or a thermal crosslinking agent in an amount of about 0.01 to 20 parts by weight based on 100 parts by weight of the total of the components (A) and (B) as required. These are used alone or in a combination of two or more.

The above photosensitive resin composition can be dissolved in a solvent such as methanol, ethanol, acetone, methyl ethyl ketone, methyl cellosolve, ethyl cellosolve, toluene, N,N-dimethylformamide or propylene glycol monomethyl ether or a mixed solvent thereof and applied as a solution with a solid content of about 30 to 60% by weight as required.

Although the above photosensitive resin composition is not particularly limited in terms of its form of use, it is preferred that the composition be used after applied on a surface of a metal such as copper, a copper alloy, iron or an iron alloy as a liquid resist, dried, and then coated with a protective film as required or be used in the form of a photosensitive element.

Further, the thickness of the photosensitive resin composition layer, though varying depending on applications, is preferably about 1 to 100 μm after drying. When the liquid resist is covered with the protective film and used, a polymer film such as a polyethylene or a polypropylene is used as the protective film, for example.

The above photosensitive element can be obtained by, for example, coating the photosensitive resin composition on a polymer film such as a polyethylene terephthalate, a polypropylene, a polyethylene or a polyester as a substrate and then drying the coated composition. The above coating can be carried out by a known method such as a roller coater, a comma coater, a gravure coater, an air-knife coater, a die coater or a bar coater. Further, the drying can be carried out at 70 to 150° C. for about 5 to 30 minutes. In addition, the amount of organic solvent remaining in the photosensitive resin composition layer is preferably 2% or less by weight in view of prevention of diffusion of the organic solvent in a subsequent step.

The thicknesses of these polymer films each are preferably 1 to 100 μm. One of these polymer films may be used as a substrate for the photosensitive resin composition layer, and other polymer film may be laminated on both surfaces of the photosensitive resin composition layer as a film for protecting the photosensitive resin composition. Adhesion between the protective film and the photosensitive resin composition layer is preferably lower than that between the photosensitive resin composition layer and the substrate, and a film with a low rate of occurrence of fish eyes is also preferred.

Further, in addition to the photosensitive resin composition layer, the substrate and the protective film, the above photosensitive element may also have an intermediate layer or protective layer such as a cushion layer, an adhesive layer, a light absorbing layer or a gas barrier layer.

To store the above photosensitive element, for example, it is wound around a cylindrical core either as it is or after a protective film is further laminated on the other surface of the photosensitive resin composition layer. In this case, the photosensitive element is preferably wound up so that the substrate is outermost. At edge faces of the thus rolled photosensitive element roll, edge face separators are preferably disposed from the viewpoint of protection of the edge faces, and moisture-proof edge face separators are preferably disposed from the viewpoint of prevention of edge fusion. Further, as a packing method, it is preferable to pack the roll with a black sheet having low moisture permeability. Illustrative examples of the above core include plastics such as a polyethylene resin, a polypropylene resin, a polystyrene resin, a polyvinyl chloride resin and an ABS resin (Acrylonitrile Butadiene Styrene copolymer).

To minimize developing time, a method of increasing viscosity (flowability) of the photosensitive layer is available. However, an increase in the flowability is liable to cause degradation in storage stability. Further, when flowability is excessively low, followability to the substrate is liable to deteriorate.

The flowability is preferably 120 to 300 μm, more preferably 120 to 260 μm, particularly preferably 140 to 220 μm. When the flowability is lower than 120 μm, the followability to the substrate is liable to deteriorate, while when the flowability is higher than 300 μm, the storage stability is liable to deteriorate.

A method of evaluating the flowability is as follows. Firstly, the photosensitive layer is stripped from the substrate film, stuck to a thickness of 2 mm without trapping bubbles, wrinkles, foreign matter and the like therein, and punched by means of a 20-mm-ϕ dumbbell-shaped puncher to prepare a test piece. Then, after the test piece is left to stand for 10 minutes on a test stand of a plastometer which has been left to stand in a thermostatic chamber at 30° C., a load of 5 kg is imposed on the test piece. An amount of change in thickness of the test piece after 15 minutes is taken as the flowability. An example of the above plastometer is an apparatus disclosed in Japanese Patent Application Laid-Open No. 54255/1990.

To produce a resist pattern by use of the above photosensitive element having the above protective film, there can be used a method in which after removal of the protective film, the photosensitive resin composition layer is pressed against or laminated on a substrate for forming a circuit at a pressure of about 0.1 to 1 MPa (about 1 to 10 kgf/cm$^2$) while being heated at about 70 to 130° C. The lamination is also possible under a reduced pressure. A surface subjected to the lamination is generally a surface of a metal but is not particularly limited.

The thus laminated photosensitive resin composition layer is irradiated with active light imagewise through a negative or positive mask pattern. As a light source of the above active light, a known light source which radiates an ultraviolet radiation, visible light or the like effectively, such as a carbon arc lamp, a mercury vapor arc lamp, a high pressure mercury vapor lamp or a xenon lamp, is used.

After the exposure, a substrate on the photosensitive resin composition layer, if present, is removed, and the photosensitive resin composition layer is then developed by removing unexposed portions through wet development, dry development or other development method using a developer such as an alkali aqueous solution, a water-based developer or an organic solvent. Thus, the resist pattern can be produced.

Illustrative examples of the above alkali aqueous solution include a dilute solution containing 0.1 to 5% by weight of sodium carbonate, a dilute solution containing 0.1 to 5% by weight of potassium carbonate, and a dilute solution containing 0.1 to 5% by weight of sodium hydroxide. The pH of the above alkali aqueous solution is preferably 9 to 11, and its temperature is adjusted according to developability of the photosensitive resin composition layer. Further, the alkali aqueous solution may contain a surfactant, an antifoaming agent, an organic solvent, and the like. As a method of carrying out the above development, dipping, spraying, brushing, slapping or the like can be used, for example.

To use the resist pattern after further curing, as a post-development treatment, the pattern may be subjected to heating at about 60 to 250° C. or an exposure of about 0.2 to 10 J/cm$^2$ as required.

To etch the metal surface after the development, a cupric chloride solution, a ferric chloride solution, an alkali etching solution or the like can be used, for example.

To produce a printed wiring board by use of the, photosensitive element of the present invention, a surface of a substrate for forming a circuit is treated by a known method such as etching or plating with the developed resist pattern used as a mask.

The above plating method may be copper plating, solder plating, nickel plating, gold plating or the like.

Then, the resist pattern can be removed by use of an aqueous solution which is more alkaline than the alkali aqueous solution used for the development, for example.

As the above strong alkali aqueous solution, an aqueous solution containing 1 to 10% by weight of sodium hydroxide or an aqueous solution containing 1 to 10% by weight of potassium hydroxide can be used, for example. As a method for carrying out the above removal, immersion, spraying or the like can be used. Further, the printed wiring pattern having the resist pattern formed thereon may be a multilayer printed wiring board and may have small-diameter through holes.

A method for measuring time for removing a layer of the photosensitive resin composition in the present invention can be carried out by the following steps (1) to, (6), for example.

(1) The photosensitive resin composition is applied onto the foregoing substrate so that a layer of the photosensitive resin composition may have a thickness of 37 to 42 μm, dried, and then laminated with a protective film as required, thereby obtaining a photosensitive element. The surface of the above substrate is preferably a polyethylene terephthalate film not subjected to a special treatment which makes it difficult to remove the photosensitive resin composition layer.

(2) A piece having a size of 30 mm×30 mm is cut out of the photosensitive element obtained in (1) and used as a sample for measuring the removal time.

(3) A surface of the substrate in the sample obtained in (2) which is opposite to the surface of the substrate on which the photosensitive resin composition layer is present and a glass substrate are bonded together by use of a double-faced tape, and the existing protective film is stripped as required so as to obtain a laminate having the glass substrate, the substrate and the photosensitive resin composition laminated in this order.

(4) A spray nozzle (product of Spraying Systems Co., Japan, a horn-shaped full corn type spray nozzle) having an internal diameter of 1.2 mm is disposed so that a distance between a point of the spray nozzle (i.e., tip of the spray nozzle) which is closest to the photosensitive resin composition layer and the photosensitive resin composition layer may be 50 mm.

(5) A 1.0 wt % sodium carbonate aqueous solution is sprayed at a spray pressure of 0.05 MPa so as to fully cover the whole surface having a size of 30 mm×30 mm of the photosensitive resin composition layer. The spray pressure can be easily determined by measuring a pressure in a tube through which the 1.0 wt % sodium carbonate aqueous solution is supplied to the spray nozzle.

(6) Then, the laminate is rinsed lightly in water in a water tank for about 5 seconds, and the remaining photosensitive resin composition layer is observed. Time required to remove the photosensitive resin composition layer completely by spraying is taken as the removal time.

A method for counting the number of holes where a cured film is broken in the present invention can be carried out by, for example, the following steps (1) to (8).

(1) The photosensitive resin composition is applied onto the foregoing substrate so that a layer of the photosensitive resin composition may have a thickness of 37 to 42 μm, dried, and then laminated with a protective film as required, thereby obtaining a photosensitive element. The surface of the above substrate is preferably a polyethylene terephthalate film not subjected to a special treatment which makes it difficult to remove the photosensitive resin composition layer.

(2) On a copper-clad laminate (manufactured by Ein Co., Ltd.) having a 35-μm-thick copper foil laminated on both surfaces and having a thickness of 1.6 mm, 18 three-continuous holes in which 3 holes each having a diameter of 6 mm are continuously integrated and which has a length of 16 mm are formed by means of a puncher as shown in FIG. 1. Then, burrs produced at the time of forming the holes in the copper-clad laminate are removed by use of a grinding machine (manufactured by SANKEI Co., Ltd.) having a brush corresponding to #600, and the resulting laminate is used as a substrate for counting the number of holes where the cured film is broken. The holes are preferably formed at a fixed interval of about 6 to 18 mm.

(3) The photosensitive resin composition layer of the photosensitive element obtained in (1) is laminated on one surface of the substrate obtained in (2) at a pressure of 0.4 MPa and a speed of 1.5 m/min by use of a heat roller at 120° C., with the existing protective film being stripped as required.

(4) The photosensitive resin composition layer laminated on the substrate in (3) is photo-cured with an exposure capable of photo-curing 24 steps in a 41-step tablet (product of Fuji Photo Film Co., Ltd., trade name: HITACHI 41 STEP TABLET) by means of an exposing device (product of ORC MANUFACTURING CO., LTD., trade name: HMW-201B) having a high pressure mercury lamp so as to obtain a cured film, and then the substrate is stripped.

(5) A spray nozzle (product of Spraying Systems Co., Japan, a horn-shaped full corn type spray nozzle) having an internal diameter of 1.2 mm is disposed so that a distance between a point of the spray nozzle (i.e., tip of the spray nozzle) which is closest to the cured film and the cured film may be 50 mm.

(6) A 1.0 wt % sodium carbonate aqueous solution is sprayed against the whole surface of the cured film at a spray pressure of 0.05 MPa three times for 36 seconds in such a manner that the solution fully covers the whole surface of the cured film. The spray pressure can be easily determined by measuring a pressure in a tube through which the 1.0 wt % sodium carbonate aqueous solution is supplied to the spray nozzle. Further, it is preferable to use a plurality of spray nozzles or swinging nozzles so as to spray the 1.0 wt % sodium carbonate aqueous solution against the 18 three-continuous holes sufficiently.

(7) Then, the holes were observed so as to count the number of holes where the cured film is broken.

(8) The above steps (1) to (7) are repeated for a total of 3 times, and an average of the numbers of holes where the cured film is broken is taken as the number of holes where the cured film is broken.

To measure time for removing the photosensitive resin composition layer of the photosensitive element when its thickness is not 37 to 42 μm or to count the number of holes where a cured film obtained by curing them is broken, there can be used, for example, a method in which a plurality of the photosensitive elements are laminated so that the photosensitive resin composition layers may overlap each other and a method comprising dissolving the photosensitive resin composition in a solvent such as acetone or dimethylformamide and preparing a photosensitive element having a thickness of 37 to 42 μm so as to have flowability of the above range. The latter method is preferred.

EXPERIMENTAL EXAMPLES

Hereinafter, the present invention will be described with reference to experimental examples.

Examples 1 to 8

Materials shown in Table 1 were mixed together so as to obtain solutions. Then, in the obtained solutions, components (B) shown in Tables 2 and 3 were dissolved so as to obtain solutions of photosensitive resin compositions.

TABLE 1

|  | Materials | Formulation (g) (1) | Formulation (g) (2) |
|---|---|---|---|
| Component (A) | Methacrylic Acid/Methyl Methacrylate/Ethyl Actrylate/Styrene Copolymer (20/57/21/2 (Weight Ratio)), Weight Average Molecular Weight = 60,000, 60 wt % Methyl Cellosolve/Toluene = 6/4 (Weight Ratio) Solution, Dispersion = 2.5 | 89 (Solid Content: 53) | 89 (Solid Content: 53) |
|  | Methacrylic Acid/Methyl Methacrylate/Butyl Acrylate/Butyl Methacrylate Copolymer (24/44/15/17 (Weight Ratio)), Weight Average Molecular Weight = 30,000, 60 wt % Methyl Cellosolve/Toluene = 6/4 (Weight Ratio) Solution, Dispersion = 2.0 | 19 (Solid Content: 11) | 19 (Solid Content: 11) |
| Component (C) | 1,7-bis(9-acrydinylheptane) | 0.4 | 0 |
|  | N,N',-tetraethyl-4,4'-diaminobenzophenone | 0.04 | 0.13 |
|  | 2-(o-chlorophenyl)-4,5-diphenylimidazole Dimer | 0 | 2.5 |
|  | N-phenylglycine | 0 | 0.05 |
| Additives | Leuco Crystal Violet | 0.9 | 0.9 |
|  | Tribromomethyl Phenylsulfone | 1.3 | 1.3 |
|  | Malachite Green | 0.05 | 0.05 |
| Solvents | Acetone | 12.0 | 12.0 |
|  | Toluene | 5.0 | 5.0 |
|  | Dimethylformamide | 0 | 3.0 |
|  | Methanol | 3.0 | 3.0 |

TABLE 2

| Component (B) | Material Formulation | Ex. 1 | Ex. 2 | Ex. 3 | Ex. 4 |
|---|---|---|---|---|---|
| FA-024M | (1) | 36 | — | — | — |
|  | (2) | — | — | — | 36 |
| FA-023M | (1) | — | 36 | — | — |
| HEMA-9P | (1) | — | — | 36 | — |
| UA-13 | (1) | — | — | — | — |
| APG-400 | (1) | — | — | — | — |
|  | (2) | — | — | — | — |
| 4G | (1) | — | — | — | — |

TABLE 3

| Component (B) | Material Formulation | Ex. 5 | Ex. 6 | Ex. 7 | Ex. 8 |
|---|---|---|---|---|---|
| FA-024M | (1) | — | — | — | — |
|  | (2) | — | — | — | — |
| FA-023M | (1) | — | — | — | — |
| HEMA-9P | (1) | — | — | — | — |
| UA-13 | (1) | 36 | — | — | — |
| APG-400 | (1) | — | 36 | — | — |
|  | (2) | — | — | 36 | — |
| 4G | (1) | — | — | — | 36 |

The materials used in Tables 2 and 3 are shown below.

FA-024M: A compound (product of Hitachi Chemical Co., Ltd.) represented by the above general formula (IV) wherein R is a methyl group and $m^3$, $n^2$ and $n^3$ are 6 (average value), with a molecular weight of 1,282 and 18 alkylene glycol units each having 2 to 6 carbon atoms.

FA-023M: A compound (product of Hitachi Chemical Co., Ltd.) represented by the above general formula (III) wherein R is a methyl group, $m^1$ and $m^2$ are –2 (average value), and $n^1$ is 12 (average value), with a molecular weight of 1,194 and 16 alkylene glycol units each having 2 to 6 carbon atoms.

HEMA-9P: A compound (product of Shin-Nakamura Chemical Corporation) represented by the above general formula (V) wherein R is a hydrogen atom, $m^4$ is 1 (average value), and $n^4$ is 9 (average value), with a molecular weight of 676 and 10 alkylene glycol units each having 2 to 6 carbon atoms.

UA-13: Poly(ethylenepropylene glycol)modified urethane dimethacrylate (product of Shin-Nakamura Chemical Co., Ltd.), with a molecular weight of 1,056 and 20 alkylene glycol units each having 2 to 6 carbon atoms.

APG-400: Heptapropylene glycol diacrylate (product of Shin-Nakamura Chemical Co., Ltd.), with a molecular weight of 532 and 7 alkylene glycol units each having 2 to 6 carbon atoms.

4G: Tetraethylene glycol dimethacrylate (product of Shin-Nakamura Chemical Co., Ltd.), with a molecular weight of 330 and 4 alkylene glycol units each having 2 to 6 carbon atoms.

Then, the obtained photosensitive resin composition solution was uniformly applied onto a polyethylene terephthalate film (product of Teijin Ltd., trade name: G2-16) having a thickness of 16 μm, dried in a hot air convention type dryer at 100° C. for 10 minutes, and then protected with a polyethylene protective film, (product of TAMAPOLY Co., LTD., trade name: NF-13) so as to obtain a photosensitive element. The photosensitive resin composition layer had a thickness of 40 μm after drying, and its flowability was adjusted within 140 to 220 μm.

Then, a copper surface of a copper-clad laminate (Hitachi Chemical Co., Ltd., trade name: MCL-E-61) which was a glass epoxy material having a copper foil (having a thickness of 35 μm) laminated on both surfaces was ground by use of a grinding machine (manufactured by SANKEI Co., Ltd.) having a brush corresponding to #600, rinsed with water, and then dried by airflow. Then, the resulting copper-clad laminate was heated to 80° C., and the above photosensitive resin composition layer was laminated on the copper surface by use of a heat roller at 120° C. at a speed of 1.5 m/min with the protective film being stripped.

Further, to evaluate resolution, a photo tool having Stopher's 21 step tablet and a photo tool having a wiring pattern whose line width/space width were 30/30 to 200/200 (unit: μm) as a negative for evaluating resolution were closely laminated, and exposure was performed with an amount of energy with which the number of steps remaining in the Stopher's 21 step tablet after development would be 8.0. The exposure was performed by use of an exposing device (product of ORC MANUFACTURING CO., LTD., trade name: HMW-201B) having a high pressure mercury lamp. The resolution was evaluated based on the smallest value of a space width between line widths when unexposed portions could be clearly removed by the development treatment. The smaller the value is, the better the resolution is evaluated as being.

To evaluate overhang stripping property, after laminated, exposed with the predetermined exposure, and then developed with the above developer as described above, the laminate was immersed in a degreasing bath (containing 20 wt % of PC-455 (product of Meltex Inc.)) for 2 minutes and then rinsed with water. Then, the resulting laminate was immersed in a soft etching bath (containing 150 g/l of ammonium persulfate) and then rinsed with water. Then, the laminate was immersed in a 10 wt % sulfuric acid bath for one minute to carry out pre-treatment, and then the resulting laminate was immersed in a copper sulfate plating bath (containing 75 g/l of copper sulfate, 190 g/l of sulfuric acid, 50 ppm of chlorine ions and 5 ml/l of Copper Gleam PCM (product of Meltex Inc.)) so as to plate the laminate with copper sulfate at room temperature and 1.2 A/dm$^2$ for 60 minutes. Subsequently, after rinsed with water, the laminate was immersed in 10 wt % fluoroboric acid for one minute and then immersed in a solder plating bath (containing 64 ml/l of 45 wt % stannous fluoroborate, 22 ml/l of 45 wt % lead fluoroborate, 200 ml/l of 42 wt % fluoroboric acid, 20 g/l of PLUTIN LA conductivity salt (product of Meltex Inc.), and 41 ml/l of PLUTIN LA starter (product of Meltex Inc.)) so as to solder-plate the laminate at room temperature and 2 A/dm$^2$ for 15 minutes. After the resulting laminate was rinsed with water and dried, the resist was stripped, and the smallest plated line width where the resist residue was measured under an optical microscope, a projector and the like. The overhang stripping property was evaluated based on the value. The larger the value is, the better the overhang stripping property is.

Further, to evaluate tent reliability, a photosensitive resin composition laminate was laminated on both surfaces of a substrate (See FIG. 1) which was a 1.6-mm-thick copper-clad laminate having irregularly shaped holes each of which was the integration of three same-sized holes each having a diameter of 4 mm, 5 mm or 6 mm, the resulting substrate was exposed at a predetermined exposure, and 36-second development was carried out for three times. After the development, the number of holes where the laminate was broken among the 216 irregularly shaped holes shown in FIG. 1 were counted, evaluated as an irregularly shaped tent breakage rate (the following expression (1)), and taken as the tent reliability.

Irregularly Shaped Tent Breakage Rate (%)=(number of holes where laminate was broken/216)×100   (1)

Further, to evaluate removability of development sludge, a piece of 0.4 m$^2$ was extracted from the photosensitive resin composition layer in the obtained photosensitive element, put in a 1.0 wt % sodium carbonate aqueous solution, agitated at 30° C. for 90 minutes by use of an agitator, and then left to stand for one week. After one week, sludge deposited at the bottom of a vessel was agitated again and removed, and an amount of sludge remaining and deposited at the bottom was observed. An amount of removed sludge was evaluated based on the following expression (2).

○=81% or more of sludge was removed.
Δ=20 to 80% of sludge was removed.
X=19% or less of sludge was removed.

Amount of Removed Sludge={(area of site where sludge remained and was deposited)/(area of bottom)}×100

The results of these are shown in Tables 4 and 5.

TABLE 4

|  | Ex. 1 | Ex. 2 | Ex. 3 | Ex. 4 |
|---|---|---|---|---|
| Overhang Allowance (μm) | 15 | 15 | 15 | 15 |
| Irregularly Shaped Tent Breakage Rate (%) | 11 | 11 | 11 | 11 |
| Resolution (μm) | 45 | 45 | 45 | 50 |
| Sludge Removability | ○ | ○ | ○ | X |

TABLE 5

|  | Ex. 5 | Ex. 6 | Ex. 7 | Ex. 8 |
|---|---|---|---|---|
| Overhang Allowance (μm) | 13 | 11 | 11 | 8 |
| Irregularly Shaped Tent Breakage Rate (%) | 22 | 50 | 50 | 89 |
| Resolution (μm) | 50 | 45 | 50 | 45 |
| Sludge Removability | ○ | Δ | X | Δ |

As is obvious from Tables 4 and 5, Examples 1, 2 and 3 in particular are excellent in overhang removability and an irregularly shaped tent breakage rate and also has good resolution and sludge removability.

Example 9

A methacrylic acid/methyl methacrylate/ethyl acrylate/styrene copolymer (20/57/21/2(weight ratio)), a weight average molecular weight=60,000, 105 g of 60 wt % methyl cellosolve/toluene=6/4 (weight ratio) solution (solid content: 64 g), 36 g of FA-024M, 0.4 g of 1,7-bis(9-acridinylheptane), 0.04 g of N,N'-tetraethyl-4,4'-diaminobenzophenone, 0.9 g of leuco crystal violet, 1.3 g of tribromomethyl phenylsulfone, 0.05 g of malachite green, 12.0 g of acetone, 5.0 g of toluene and 3.0 g of methanol were mixed together so as to obtain a solution.

Then, the obtained photosensitive resin composition solution was uniformly applied onto a polyethylene terephthalate film (trade name: G2-16, product of Teijin Ltd.) having a thickness of 16 μm, dried in a hot air convention type dryer at 100° C. for 10 minutes, and then protected with a polyethylene protective film (trade name: NF-13, product of TAMAPOLY CO., LTD.) so as to obtain a photosensitive resin composition laminate. The photosensitive resin composition layer had a thickness of 40 μm after drying.

Example 10

A methacrylic acid/methyl methacrylate/ethyl acrylate copolymer (17.5/52.5/30 (weight ratio)), a weight average molecular weight=80,000, 89 g of 60 wt % methyl cellosolve/toluene=6/4 (weight ratio) solution (solid content: 53 g), a methacrylic acid/methyl methacrylate/butyl acrylate/butyl methacrylate copolymer (24/44/15/17), a weight average molecular weight=30,000, 19 g of 60 wt % methyl cellosolve/toluene=6/4 (weight ratio) solution (solid content: 11 g), 36 g of FA-024M, 0.4 g of 1,7-bis(9-acridinylheptane), 0.04 g of N,N'-tetraethyl-4,4'-diaminobenzophenone, 0.9 g of leuco crystal violet, 1.3 g of tribromomethyl phenylsulfone, 0.05 g of malachite green, 12.0 g of acetone, 5.0 g of toluene and 3.0 g of methanol were mixed together so as to obtain a solution.

Then, the obtained photosensitive resin composition solution was uniformly applied onto a polyethylene terephthalate film (trade name: G2-16, product of Teijin Ltd.) having a thickness of 16 μm, dried in a hot air convention type dryer at 100° C. for 10 minutes, and then protected with a polyethylene protective film (trade name: NF-13, product of TAMAPOLY CO., LTD.) so as to obtain a photosensitive resin composition laminate. The photosensitive resin composition layer had a thickness of 40 μm after drying.

Then, pieces having a size of 30 mm×30 mm were cut out of the photosensitive elements obtained in the Examples 1, 2, 6, 8, 9 and 10 and then laminated on glass substrates so that the polyethylene terephthalate films of the photosensitive elements might come in contact with the glass substrates, and then the polyethylene protective films were stripped, thereby obtaining laminates each having the glass substrate, the polyethylene terephthalate film and the photosensitive resin composition laminated in this order.

Then, a spray nozzle (product of Spraying System Japan Co., Ltd., a horn-shaped full corn type spray nozzle) having an internal diameter of 1.2 mm was disposed so that a distance between a point of the spray nozzle (i.e., tip of the spray nozzle) which was closest to the photosensitive resin composition layer and the photosensitive resin composition layer might be 50 mm. A 1.0 wt % sodium carbonate aqueous solution was sprayed at a spray pressure of 0.05 MPa so as to fully cover the whole surface having a size of 30 mm×30 mm of the photosensitive resin composition layer. Time required to remove the photosensitive resin composition completely was taken an removal time of the photosensitive resin composition layer. The results are shown in Table 6.

Further, on a 1.6-mm-thick copper-clad laminate (product of Ein Co., Ltd.) having a 35-μm-thick copper foil laminated on both surfaces, 18 three-continuous holes in which 3 holes each having a diameter of 6 mm were continuously integrated and which had a length of 16 mm were formed by means of a puncher as shown in FIG. 1. Then, burrs produced at the time of forming the holes were removed by use of a grinding machine (product of SANKEI Co., Ltd.) having a brush corresponding to #600, and the resulting laminate was used as a substrate for counting the number of holes where the cured film was broken. The holes were formed at intervals of 10 mm.

Then, the photosensitive resin composition layers of the photosensitive elements obtained in the obtained Examples 1, 2, 6, 8, 9 and 10 were laminated at a pressure of 0.4 MPa and a speed of 1.5 m/min by use of a heat roller at 120° C., with the polyethylene protective films being stripped. The photosensitive resin composition layers laminated on the substrates for counting the number of holes where the cured film was broken were photo-cured with an exposure capable of photo-curing 24 steps in a 41-step tablet (product of Fuji Photo Film Co., Ltd., trade name: HITACHI 41 STEP TABLET) by means of an exposing device (product of ORC MANUFACTURING CO., LTD., trade name: HMW-201B) having a high pressure mercury lamp so as to obtain cured films, and then the substrates were stripped.

Then, a spray nozzle (product of Spraying System Japan Co., Ltd., a horn-shaped full corn type spray nozzle) having an internal diameter of 1.2 mm was disposed so that a distance between a point of the spray nozzle (i.e., tip of the spray nozzle) which is closest to the cured film and the cured film might be 50 mm. A 1.0 wt % sodium carbonate aqueous solution was sprayed against the whole surface of the cured film at a spray pressure of 0.05 MPa three times for 36 seconds in such a manner that the solution would fully cover the whole surface of the cured film. The holes were observed so as to count the number of holes where the cured film was broken The results are shown in Table 6. Six spray nozzles were disposed at intervals of 30 mm so that the 1.0 wt % aqueous sodium carbonate solution might be sufficiently sprayed against the 18 three-continuous holes.

TABLE 6

| | Removal Time (seconds) | Number of Holes Where Cured Film was Broken |
|---|---|---|
| Example 1 | 18 | 3 |
| Example 2 | 18 | 3 |
| Example 6 | 18 | 6 |
| Example 8 | 18 | 15 |
| Example 9 | 22 | 3 |
| Example 10 | 25 | 3 |

As described above, an improvement in production line of a printed wiring board was attempted by use of the photosensitive elements obtained in Examples 1, 2, 6, 8, 9 and 10. Of these, the photosensitive elements obtained in Examples 1 and 2 in particular could prevent entry of an etching solution, a plating solution or the like into through holes efficiently, prevent poor conduction, an improper short and the like in a printed wiring board, and produce printed wiring boards at high yields.

POSSIBILITY OF INDUSTRIAL UTILIZATION

As described above, the present invention produces printed wiring boards at high yield, accelerates a production line of the printed wiring boards significantly and reduces production time of the printed wiring boards, thereby making it possible to improve workability and productivity. Therefore, the present invention is useful.

Further, the present invention is also useful for achieving a higher density and higher resolution of a printed wiring board.

The invention claimed is:

1. A photosensitive resin composition comprising (A) a binder polymer having a weight average molecular weight of from 30,000 to 70,000, (B) a photopolymerizable compound and (C) a photopolymerization initiator, wherein component (B) contains a polyalkylene glycol di(meth)acrylate having both an ethylene glycol chain and a propylene glycol chain in its molecule, which polyalkylene glycol di(meth)acrylate comprises 15 or more alkylene glycol units each having 2 to 6 carbon atoms, and component (C) contains an acridine-based compound represented by general formula (II):

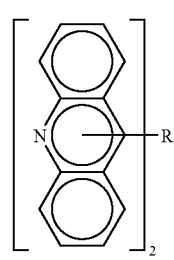

(II)

wherein $R^3$ represents an alkylene group having 6 to 12 carbon atoms.

2. The photosensitive resin composition according to claim 1, wherein the polyalkylene glycol di(meth)acrylate has a molecular weight of not lower than 900.

3. The photosensitive resin composition of claim 1, wherein based on 100 parts by weight of a total of components (A) and (B), the amount of component (A) is 40 to 80 parts by weight, the amount of component (B) is 20 to 60 parts by weight, and the amount of component (C) is 0.01 to 3 parts by weight.

4. A photosensitive element prepared by applying the photosensitive resin composition of claim 1 on a substrate, and drying the applied composition.

5. A production method of a resist pattern, comprising: laminating the photosensitive element of claim 4 on a substrate for forming a circuit so that the photosensitive resin composition layer comes in intimate contact with the substrate; irradiating it with active light imagewise so as to photocure an exposed portion; and removing an unexposed portion by development.

6. A production method of a printed wiring board, comprising: etching or plating a substrate to form a circuit which has a resist pattern produced thereon by the resist pattern production method of claim 5.

7. The composition of claim 1, wherein binder polymer (A) has a weight average molecular weight of from 35,000 to 65,000.

8. The composition of claim 1, wherein binder polymer (A) has a weight average molecular weight of from 40,000 to 60,000.

9. The photosensitive resin composition according to claim 1, wherein the polyalkylene glycol di(meth)acrylate has 15 to 25 alkylene glycol units each having 2 or 3 carbon atoms.

10. The photosensitive resin composition according to claim 1, wherein the polyalkylene glycol di(meth)acrylate has a molecular weight of from 1,000 to 1,500.

11. The photosensitive resin composition of claim 1, wherein based on 100 parts by weight of a total of components (A) and (B), the amount of component (A) is 45 to 70 parts by weight, the amount of component (B) is 30 to 55 parts by weight, and the amount of component (C) is 0.1 to 2 parts by weight.

12. A photosensitive resin composition comprising (A) a binder polymer having a weight average molecular weight of from 35,000 to 65,000, (B) a photopolymerizable compound and (C) a photopolymerization initiator, wherein component (B) contains a polyalkylene glycol di(meth)acrylate having both an ethylene glycol chain and a propylene glycol chain in its molecule, which polyalkylene glycol di(meth)acrylate comprises 15 to 20 alkylene glycol units each having 2 or 3 carbon atoms, and component (C) contains an acridine-based compound represented by general formula (II):

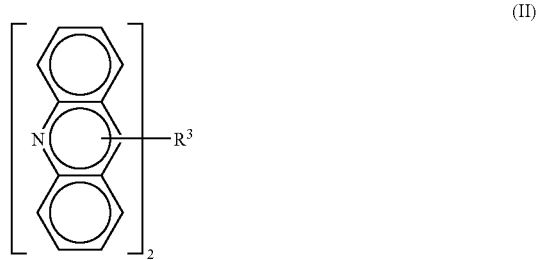

(II)

wherein $R^3$ represents an alkylene group having 6 to 12 carbon atoms.

13. The photosensitive resin composition of claim 12, wherein based on 100 parts by weight of a total of components (A) and (B), the amount of component (A) is 45 to 70 parts by weight, the amount of component (B) is 30 to 55 parts by weight, and the amount of component (C) is 0.1 to 2 parts by weight.

* * * * *